(12) United States Patent
An (10) Patent No.: US 8,248,874 B2
(45) Date of Patent: Aug. 21, 2012

(54) SEMICONDUCTOR MEMORY APPARATUS AND PROBE TEST CONTROL CIRCUIT THEREFOR

(75) Inventor: Sun Mo An, Icon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 322 days.

(21) Appl. No.: 12/642,429

(22) Filed: Dec. 18, 2009

(65) Prior Publication Data

US 2010/0309739 A1 Dec. 9, 2010

(30) Foreign Application Priority Data

Jun. 9, 2009 (KR) ........................ 10-2009-0050795

(51) Int. Cl.
*G11C 29/00* (2006.01)
(52) U.S. Cl. ................................. 365/201; 365/230.06
(58) Field of Classification Search .................. 365/201, 365/230.03
See application file for complete search history.

(56) References Cited

U.S. PATENT DOCUMENTS

| | | | |
|---|---|---|---|
| 5,289,416 A * | 2/1994 | Iwai et al. ...................... 365/200 |
| 5,864,510 A | 1/1999 | Nakaoka | |
| 6,546,512 B1 | 4/2003 | Ochoa et al. | |
| RE40,105 E | 2/2008 | Momohara | |
| 7,521,947 B2 | 4/2009 | Rogers et al. | |
| 2001/0047496 A1* | 11/2001 | Hidaka et al. ...................... 714/5 |
| 2003/0188238 A1 | 10/2003 | Partsch et al. | |
| 2005/0213397 A1 | 9/2005 | Santin | |
| 2006/0123291 A1 | 6/2006 | Kim | |
| 2008/0002488 A1* | 1/2008 | Hasegawa et al. ............ 365/200 |
| 2009/0002003 A1 | 1/2009 | Kim et al. | |

FOREIGN PATENT DOCUMENTS

| | | |
|---|---|---|
| JP | 2007-184538 | 7/2007 |
| JP | 2007-315888 | 12/2007 |
| KR | 1020020036085 A | 5/2002 |
| KR | 1020040025192 A | 3/2004 |
| KR | 100495918 B1 | 6/2005 |
| KR | 1020050094113 A | 9/2005 |

* cited by examiner

*Primary Examiner* — Michael Tran
(74) *Attorney, Agent, or Firm* — William Park & Associates Ltd.

(57) ABSTRACT

Disclosed probe test control circuit includes: a bank active circuit configured to generate a bank active signal in response to a bank address and bank-by-bank test control signals; and a mat active circuit configured to generate a mat-by-mat sub-wordline selection signal and provide the mat-by-mat sub-wordline selection signal to a selected memory bank, in response to a row address signal, a row address enable signal and a mat-by-mat test control signal.

21 Claims, 7 Drawing Sheets

SEMICONDUCTOR MEMORY APPARATUS AND PROBE TEST CONTROL CIRCUIT THEREFOR

CROSS-REFERENCES TO RELATED APPLICATION

The present application claims priority to Korean Application No. 10-2009-0050795, filed on Jun. 9, 2009, which is incorporated by reference in its entirety as set forth in full.

BACKGROUND

1. Technical Field

Various embodiments described herein relate to a semiconductor integrated circuit and, more particularly, to a semiconductor memory apparatus and a probe test control circuit for the semiconductor memory apparatus.

2. Related Art

As the size of semiconductor memory apparatuses decreases, memory cells are fabricated in the form of bulb ring gate (BRG) for circuits smaller than 66 nm. Presently, the BRG process is being used to circuits as small as 55 nm. In this BRG process, a leakage current between an enabled wordline and an adjacent wordline may increase. Consequently, there may be a need for conducting a test to verify whether or not there is any defect caused by the leakage current.

In the past, a wordline test was performed by enabling each wordline one by one, thereby requiring a great deal of testing time.

To solve this problem, a method of performing the test by enabling one sub-wordline per 4 sub-wordlines was proposed. However, with recent trends toward making high capacity semiconductor memory apparatuses, even though ¼ sub-wordlines were enabled, the total number of sub-wordlines that must be enabled for a test increases inevitably. Due to this increase, the equipments that support the enabling operations during tests may lack sufficient, current driving capability thereby making it difficult to perform the test.

In order to overcome the above-mentioned problems, researchers have used a method in which the testing is performed by enabling a plurality of wordlines on a bank-by-bank or mat-by-mat basis (i.e., in the unit of bank or mat instead of activating all banks) at a package level.

In general, a mobile memory apparatus is provided at a bear chip state. Whether the memory apparatus at a bear chip state has a defect is verified by performing a wafer burn-in test. Moreover, a probe test is performed to verify whether there is a defect in writing and reading operations.

When performing a probe test on a mobile memory apparatus, however, the test mode is fixed such that all of the banks are activated during the test, making it impossible to perform the test on a bank-by-bank or mat-by-mat basis. Consequently, high-capacity mobile memory apparatuses, for example, require testing equipments having enhanced current driving capability. Therefore, high-capacity mobile memory apparatuses, for example, require testing equipments having high-performance current driving capability, thereby causing a cost increase for performing the test.

SUMMARY

One embodiment of the present invention includes a semiconductor memory apparatus capable of activating wordlines on a bank-by-bank or mat-by-mat basis during a probe test mode and a probe test control circuit for such a semiconductor memory apparatus.

Another embodiment of the present invention includes a semiconductor memory apparatus capable of testing a memory apparatus at a bear chip state on a bank-by-bank or mat-by-mat basis and a probe test control circuit for such a semiconductor memory apparatus.

In one embodiment of the present invention, a probe test control circuit includes: a bank active circuit configured to generate a bank active signal in response to a bank address and bank-by-bank test control signals; and a mat active circuit configured to generate a mat-by-mat sub-wordline selection signal and provide the mat-by-mat sub-wordline selection signal to a selected memory bank, in response to a row address signal, a row address enable signal and a mat-by-mat test control signal.

In another embodiment of the present invention, a probe test control circuit includes: a bank active circuit configured to activate at least one memory bank; a mat active circuit configured to activate at least one memory mat included in the activated memory bank; and an address decoder configured to enable a plurality of wordlines in the activated memory bank at every predetermined unit.

In still another embodiment of the present invention, a semiconductor memory apparatus includes: a memory cell region including a plurality of memory banks with a plurality of memory mats, respectively; a mode register set configured to generate a bank-by-bank/mat-by-mat test control signal; and a probe test control circuit configured to generate a bank active signal and a mat-by-mat sub-wordline selection signal to the memory cell region, in response to the bank-by-bank/mat-by-mat test control signal and a row address signal.

BRIEF DESCRIPTION OF THE DRAWINGS

The accompanying drawings, which are incorporated in and constitute a part of this specification, illustrate various embodiments consistent with the invention, and, together with the description, serve to explain the principles of the invention.

DETAILED DESCRIPTION

Reference will now be made in detail to the exemplary embodiments consistent with the invention, examples of which are illustrated in the accompanying drawings. Wherever possible, the same reference numbers or characters will be used throughout the drawings to refer to the same or like parts.

Generally, during a probe test mode of a memory apparatus at a bear chip state, the testing process is fixed such that all memory banks are activated. However, in certain embodiments of the present invention, a specific memory bank can be activated by a bank address and a specific test mode signal.

In addition, when the desired memory bank is activated, the semiconductor memory apparatus and the associated probe test control circuit may select a specific memory mat in the corresponding memory bank and then perform a test by enabling a wordline in the selected memory mat.

Figure 1:
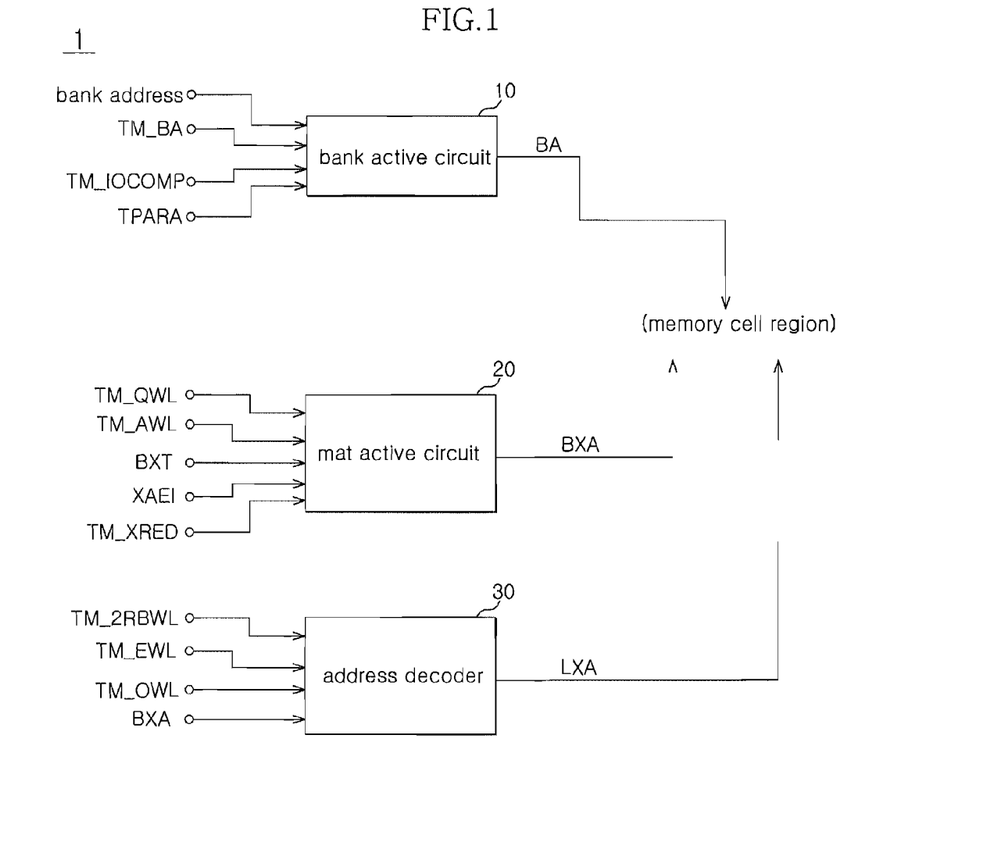
FIG. 1 is a block diagram schematically illustrating an exemplary configuration of a probe test control circuit according to one aspect of the present disclosure.

FIG. 1 is a block diagram schematically illustrating an exemplary configuration of a probe test control circuit according to one aspect of the present disclosure.

As shown in FIG. 1, the probe test control circuit 1 includes: a bank active circuit 10, a mat active circuit 20, and an address decoder 30.

To perform the probe test on a bank-by-bank basis on the memory apparatus at a bear chip state, the bank active circuit 10 receives a bank address and then generates a bank active signal BA in response to a bank-by-bank test control signal. Here, the bank-by-bank test control signal may include a bank selection signal TM_BA, a compact test mode signal TM_IOCOMP and a parallel test mode signal TPARA.

The bank active signal BA is provided to a plurality of memory banks placed at a memory cell region and makes a specific bank to be designated by bank active signal BA.

To perform the test on a mat-by-mat basis on the memory bank activated by the bank active circuit 10, the mat active circuit 20 receives a row address signal BXT and then outputs a mat-by-mat sub-wordline selection signal BXA in response to a row address enable signal XAEI and a mat-by-mat test control signal.

Here, the mat-by-mat test control signal can include a partial wordline test enable signal TM_QWL and an entire wordline test enable signal TM_AWL. In addition, the mat-by-mat test control signal can further include a redundancy test enable signal TM_XRED.

The mat-by-mat sub-wordline selection signal BXA can be a sub-wordline selection signal, a main wordline selection signal, a mat selection signal, and also can be a redundancy wordline selection signal. The mat selection signal is provided to the memory cell region that contains a plurality of memory banks, and then makes a specific mat in the bank be activated by the bank active circuit 10.

Meanwhile, the address decoder 30 receives the sub-wordline selection signal of the mat-by-mat sub-wordline selection signal BXA from the mat active circuit 20, and generates a sub-wordline address signal LXA in response to wordline-by-wordline test mode signals.

Here, the wordline-by-wordline test mode signals include a sub-wordline enable signal TM_2RBWL, an even wordline test mode signal TM_EWL, and an odd wordline test mode signal TM_OWL.

As shown in FIG. 1, performing a probe test for operating a parallel test mode (namely, TPARA) in which all banks are activated requires the probe test control circuit of the embodiment to use the compact test mode signal TM_IOCOMP, which enables a bank-by-bank activation. In addition, the probe test control circuit of the embodiment selectively activates a mat in the activated bank by using the partial wordline test enable signal TM_QWL. Regarding the activated mat in the activated bank, the probe test control circuit of the embodiment enables one wordline per 4 wordlines by using the partial wordline test enable signal TM_QWL. Therefore, it is possible to perform the test on the enabled wordline.

Figure 2:
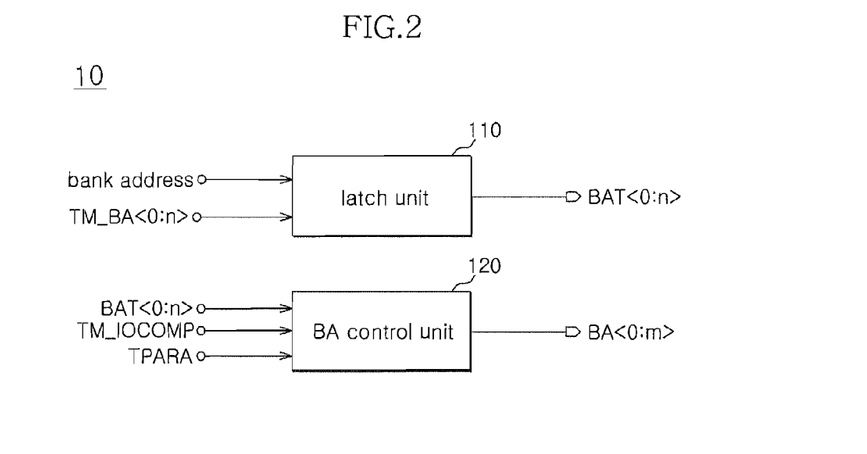
FIG. 2 is a block diagram showing an exemplary configuration of a bank active circuit of FIG. 1.

FIG. 2 is a block diagram of an embodiment of a bank active circuit of FIG. 1. In FIG. 2, the bank active circuit 10 includes a latch unit 110 and a bank active signal control unit 120. The latch unit 110 outputs address latch signals BAT<0:n> that are latched signals of bank selection signals TM_BA<0:n> in response to a bank address signal and bank selection signals TM_BA<0:n>. The normal probe test is performed by activating all banks at the same time and thus inputting the bank address signal at a floating state.

To perform the test on a bank-by-bank basis instead of activating all banks, the bank selection signals TM_BA<0:n> are generated from a mode register set MSR and are used as inputs of the latch unit 110, according to the embodiment.

Meanwhile, the bank active signal control unit 120 outputs bank active signals BA<0:m> in response to the address latch signals BAT<0:n>, the compact test mode signal TM_IOCOMP, and the parallel test mode signal TPARA.

The parallel test mode signal TPARA activates all banks when performing the normal probe test. To enable an independent activation and perform the test on a bank-by-bank basis, the probe test control circuit of the embodiment uses the bank selection signals TM_BA<0:n> and the compact test mode signal TM_IOCOMP, respectively.

Figure 3:
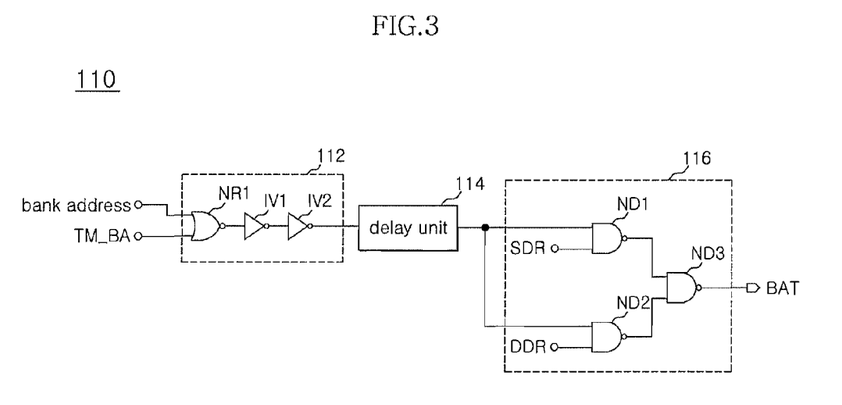
FIG. 3 is a diagram showing an exemplary configuration of a latch unit of FIG. 2.
Figure 4:
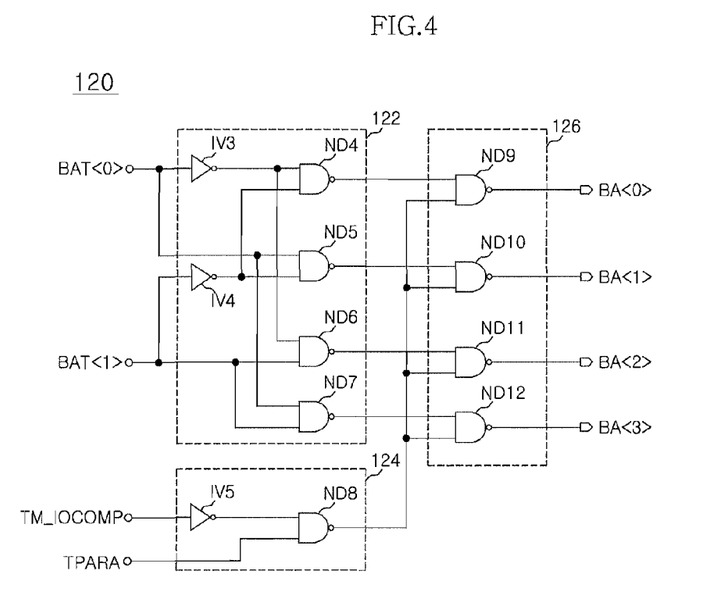
FIG. 4 is a diagram showing an exemplary configuration of a bank active signal control unit of FIG. 2.

The bank active signals BA<0:m> from the bank active circuit 10 are determined by the bank selection signals TM_BA<0:n>, described in FIGS. 3 and 4.

FIG. 3 is a diagram showing an exemplary configuration of a latch unit of FIG. 2. In FIG. 3, the latch unit 110 includes an input unit 112, a delay unit 114 and a first output unit 116.

The input unit 112 is composed of logic elements that receive the bank address signal and the bank selection signal TM_BA. The output level of the input unit 112 varies with the logic level of the bank selection signal TM_BA. For example, coupling a NOR gate NR1 and inverters IV1 and IV2 in series can constitute the input unit 112, as shown in FIG. 3.

The delay unit 114 delays an output signal of the input unit 112 for a predetermined amount of time before transferring the signal.

The output signal from the delay unit 114 is transferred to the first output unit 116. The first output unit 116 then outputs an address latch signal BAT in response to mode control signals SDR and DDR. In this operation, the first output unit 116 can include a first NAND gate ND1 for receiving an output signal from the delay unit 114 and the first mode control signal SDR, a second NAND gate ND2 for receiving the output signal from the delay unit 114 and the second mode control signal DDR, and a third NAND gate ND3 for performing a logic combination on the output signals from the first and second NAND gates ND1 and ND2.

Since the bank address signal is at a floating state, bank selection signal TM_BA determines the output signal from the latch unit 110.

The bank address signal is an input signal of the input unit 112 when in a floating state, causing the input unit 112 to operate like a NOR gate. Accordingly, an output signal of the input unit 112 is determined by the level of the bank selection signal TM_BA. The first mode control signal SDR, on the other hand, has a logic level opposite to the second mode control signal DDR. Therefore, the bank selection signal TM_BA affects the output level of the third NAND gate ND3 regardless of the mode control signals SDR and DDR.

The address latch signal BAT is transferred to the bank active signal control unit 120. FIG. 4 is a diagram of an embodiment of the bank active signal control unit described in FIG. 2.

The bank active signal control unit 120 includes a decoding unit 122, a test mode decision unit 124 and a second output unit 126. Here, the address latch signal BAT can be inputted with a plurality of bits. The bank active signal control unit 120 which generates bank active signals BA<0:4> from 2-bit address latch signals BAT<0:1> is shown in FIG. 4.

First, the decoding unit 122 receives the 2-bit address latch signals BAT<0:1> and decodes them to 4-bit signals.

The test mode decision unit 124 receives the compact test mode signal TM_IOCOMP and the parallel test mode signal TPARA as inputs. Here, the test mode decision unit 124 is configured so that the parallel test mode signal TPARA will not affect the bank active signal BA when the compact test mode signal TM_IOCOMP is enabled, or when the test is performed on a bank-by-bank basis.

In accordance with the output level of the test mode decision unit 124, the second output unit 126 outputs either a decoding result of the decoding unit 122 or the bank active signals BA<0:3> to activate all banks.

According to the embodiment, the decoding unit 122 includes: a logic element ND4 for receiving signals inverted by inverters IV3 and IV4 from the first and second address latch signals BAT<0:1>, respectively; a logic element ND5 for receiving the first address latch signal BAT<0> and the second address latch signal BAT<1> inverted by the inverter IV4; a logic element ND6 for receiving the second address latch signal BAT<1> and the first address latch signal BAT<0> inverted by the inverter IV3; and a logic element ND7 for receiving the first and second address latch signals BAT<0:1>.

Here, the logic elements ND4 to ND7 included in the decoding unit 122 are composed of NAND gates. They output signals of low logic levels only when all of their input signals are at high logic levels.

The test mode decision unit 124 includes: an inverter IN5 that inverts the compact test mode signal TM_IOCOMP; and a logic element ND8 that receives the inverted compact test mode signal TM_IOCOMP and the parallel test mode signal TPARA and outputs a signal having a high logic level regardless of the state of the parallel test mode signal TPARA when the compact test mode signal TM_IOCOMP is enabled at a high logic level. Here, the logic element ND8 is composed of a NAND gate, outputting a signal with a low logic level only when all of its input signals are at high logic levels. Even when the parallel test mode signal TPARA is inputted with a high logic level, if the compact test mode signal TM_IO-COMP for the bank-by-bank test is inputted having a high logic level, an output level of the logic element ND8 substantially becomes a high logic level.

The second output unit 126 includes logic elements ND9-ND12, which receive each of output signals of the logic elements ND4-ND7 of the decoding unit 122 and an output signal of the test mode decision unit 124, respectively. Here, the logic elements ND9-ND12 included in the second output unit 126 can be composed of NAND gates. Therefore, output levels of the second output unit 126 are determined according to the output signal level of the test mode decision unit 124.

For example, assume that the output level of the test mode decision unit 124 is at a high logic level. This is the case where the compact test mode signal TM_IOCOMP is at a high logic level, that is, where the probe test control circuit of the embodiment performs the test on a bank-by-bank basis. Here, the second output unit 126 inverts output signals of the decoding unit 122 and then outputs them as the bank active signals BA<0:3>. But when the output level of the test mode decision unit 124 is at a low logic level, that is, when the parallel test mode is performed, the second output unit 126 outputs the bank active signals BA<0:3> with high logic levels, regardless of the output signals from the decoding unit 122.

For example, in the case of the semiconductor memory apparatus with 4 banks, 2-bit bank selection signals TM_BA<0:1> are inputted and then 4-bit bank active signals BA<0:3> are outputted.

Here, the banks activated in accordance with logic levels of the bank selection signals TM_BA<0:1> can be controlled as following Table 1.

TABLE 1

| bank selection signals TM_BA<0:1> | activated bank |
|---|---|
| 00 | bank 0 |
| 01 | bank 1 |
| 10 | bank 2 |
| 11 | bank 3 |

In order to substantially prevent all banks from being activated by the parallel test mode signal TPARA, enabled during the probe test to activate the desired banks only, the bank selection signal TM_BA and the compact test mode signal TM_IOCOMP are used in the embodiment. When the compact test mode signal is enabled, the probe test control circuit of the embodiment latches to and decodes the bank selection signal TM_BA, and then outputs the bank active signal BA. Accordingly, it is possible to selectively activate the desired bank.

It is also possible to activate each bank independently during the probe test and subsequently perform the test on a mat-by-mat basis by activating a desired mat in the activated bank.

The mat active circuit 20 that selectively activates a mat in the activated bank after the specific bank is activated will now be described.

Figure 5:
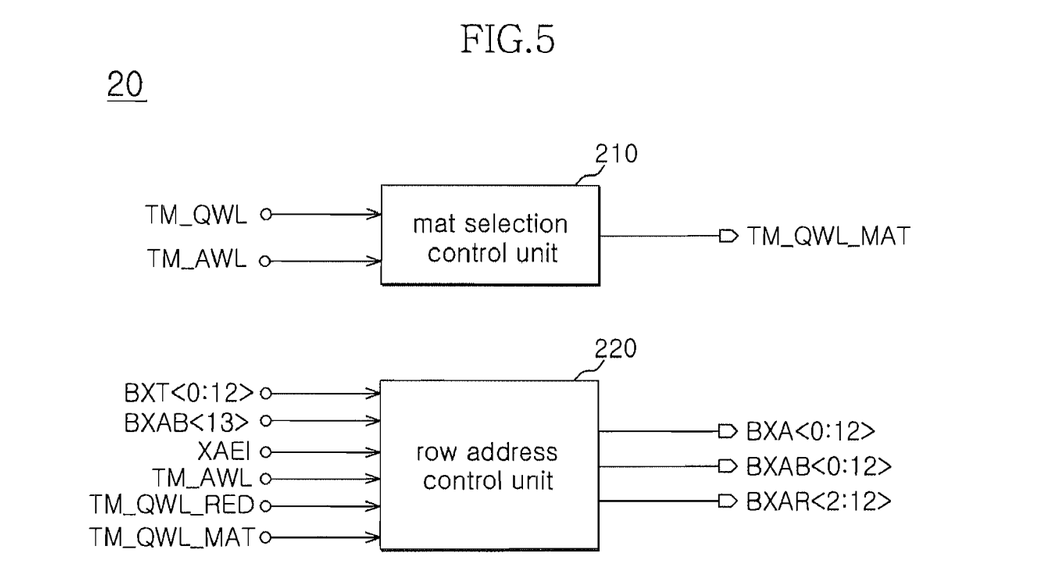
FIG. 5 is a block diagram showing an exemplary configuration of a mat active circuit of FIG. 1.

FIG. 5 is a block diagram of an embodiment of a mat active circuit, which includes a mat selection control unit 210 and a row address control unit 220.

First, the mat selection control unit 210 receives the partial wordline test enable signal TM_QWL and the entire wordline test enable signal TM_AWL and then generates a mat-by-mat wordline test signal TM_QWL_MAT.

Meanwhile, the row address control unit 220 receives row address signals BXT<0:12> and BXAB<13> and is enabled in response to the row address enable signal XAEI. The row address control unit 220 then decodes a mat address and a wordline address that will be enabled in response to the entire wordline test enable signal TM_AWL, a redundancy wordline test enable signal TM_QWL_RED and the mat-by-mat wordline test signal TM_QWL_MAT.

In other words, the mat active circuit 20 generates the mat-by-mat wordline test signal TM_QWL_MAT with the partial wordline test enable signal TM_QWL. In response to an input address signal and the mat-by-mat wordline test signal TM_QWL_MAT, the mat active circuit 20 selects a mat to be activated and enables a wordline of the selected mat.

Figure 6:
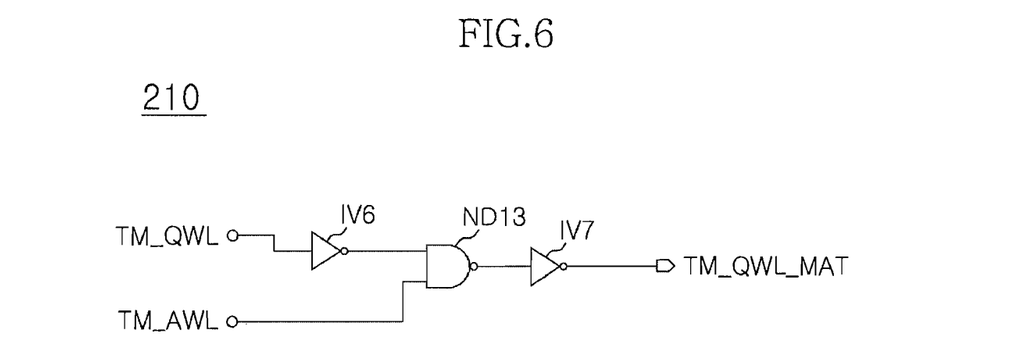
FIG. 6 is a diagram showing an exemplary configuration of a mat selection control unit of FIG. 5.

FIG. 6 is a diagram showing an exemplary configuration of the mat selection control unit of FIG. 5. The mat selection control unit 210 receives the partial wordline test enable signal TM_QWL and the entire wordline test enable signal TM_AWL. Its output, the mat-by-mat wordline test signal TM_QWL_MAT, has a level determined by the level of the partial wordline test enable signal TM_QWL, regardless of the level of the entire wordline test enable signal TM_AWL.

The mat selection control unit 210 can include an inverter IV6 for inverting the partial wordline test enable signal TM_QWL, a logic element ND13 for receiving an output signal from the inverter IV6 and the entire wordline test enable signal TM_AWL, and an inverter IV7 for inverting an output signal of the logic element ND13. Here, the logic element ND13 can be composed of a NAND gate.

When performing the probe test mode, the entire wordline test enable signal TM_AWL is inputted with a high logic level. Therefore, the mat-by-mat wordline test signal TM_QWL_MAT and the partial wordline test enable signal TM_QWL have opposite logic levels.

Figure 7:
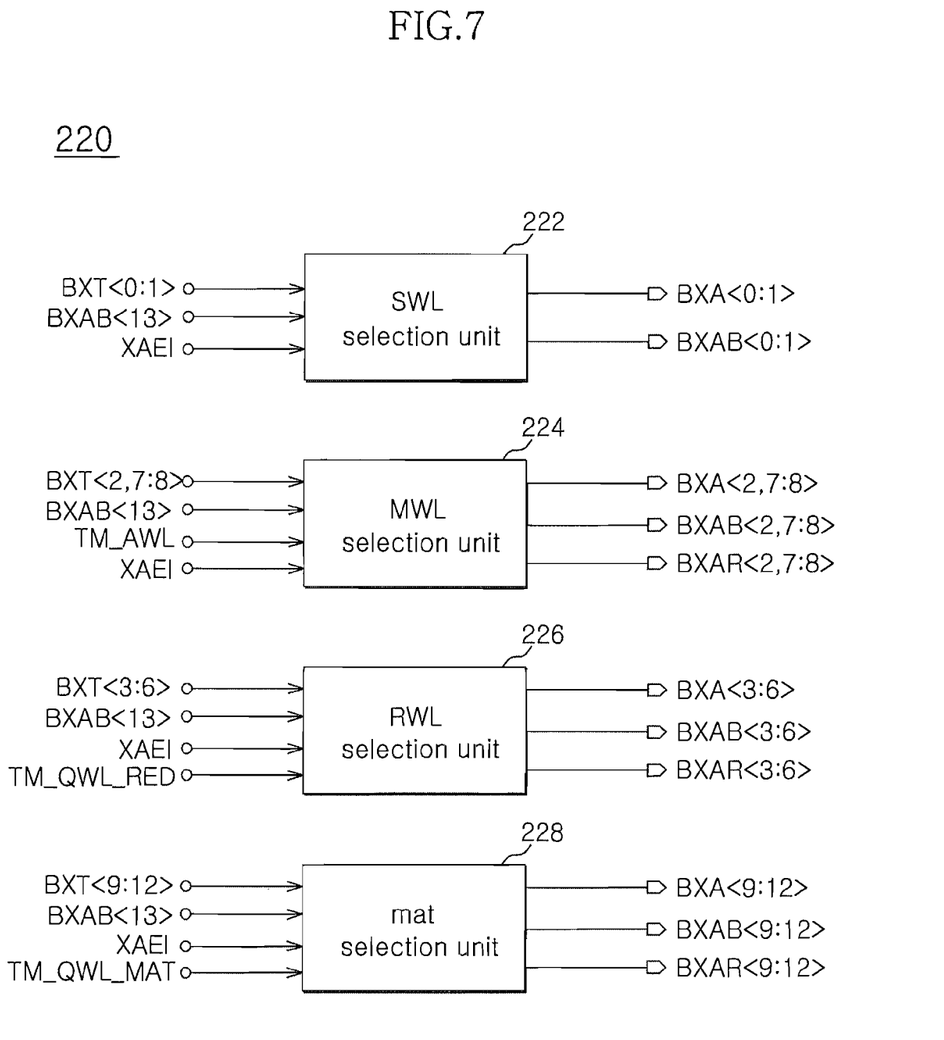
FIG. 7 is a block diagram showing an exemplary configuration of a row address control unit of FIG. 5.

FIG. 7 is a block diagram showing an exemplary configuration of the row address control unit of FIG. 5.

For example, in a 2G-bit mobile memory apparatus, a row address comprises 14 bits A<0:13>. The row address control unit 220 for the semiconductor memory apparatus has the same 14-bit row addresses, as shown in FIG. 7.

Of 14-bit row addresses A<0:13>, the most significant bit A<13> is a flag signal to select half of the banks. A mat and a wordline are selected by using the rest of bits A<0:12>.

More specifically, the lower 3 bits A<0:2> of row addresses A<0:12> decode an address of 8 sub-wordlines. Row address A<2> is used to divide sub-wordlines into 2 groups i.e., a lower group SWL<0:3> and an upper group SWL<4:7> and select one of them.

Here, row addresses A<3:8> decode addresses of main wordlines. In particular, row addresses A<3:6> decode addresses of redundancy wordlines. Row addresses A<9:12> are used to decode mat addresses.

In FIG. 7, the row address control unit 220 can include a sub-wordline selection unit 222, a main wordline selection unit 224, a redundancy wordline selection unit 226 and a mat selection unit 228.

The sub-wordline selection unit 222 receives row address signals BXT<0:1> for latching lower 2-bit row addresses A<0:1>, the row address signal BXAB<13> for latching the most significant address A<13>, and the row address enable signal XAEI; and outputs sub-wordline selection signals BXA<0:1> and their inverted signals BXAB<0:1>.

The main wordline selection unit 224 receives row address signals BXT<2,7:8> for latching row addresses A<2,7:8>, the row address signal BXAB<13> for latching the most significant address A<13>, the row address enable signal XAEI. It also receives the entire wordline test enable signal TM_AWL to select one of the main wordline and the 2 sub-wordline groups. In addition, it outputs main wordline selection signals BXA<2,7:8>, their inverted signals BXAB<2,7:8>, and their delayed signals BXAR<2,7:8>.

Therefore, the main wordline selection unit 224 enables selection of the main wordline as well as any upper or lower group of sub-wordlines electrically connected to the main wordline.

Meanwhile, a redundancy wordline selection unit 226 receives row address signals BXT<3:6> for latching the row addresses A<3:6>, the row address signal BXAB<13> for latching the most significant address A<13>, the row address enable signal XAEI, and the redundancy wordline test enable signal TM_QWL_RED. It outputs redundancy wordline selection signals BXA<3:6>, their inverted signals BXAB<3:6>, and their delayed signals BXAR<3:6>.

In addition, the mat selection unit 228 receives row address signals BXT<9:12> for latching row addresses A<9:12>, the row address signal BXAB<13> for latching the most significant address A<13>, the row address enable signal XAEI, and the mat-by-mat wordline test signal TM_QWL_MAT. It outputs mat selection signals BXA<9:12>, their inverted signals BXAB<9:12>, and their delayed signals BXAR<9:12>.

Therefore, the mat selection unit 228 selects a mat to be tested, and the sub-wordline selection unit 222 and the main wordline selection unit 224 determine addresses of the main wordline and the sub-wordline of the selected mat. In addition, when performing the test on a redundancy wordline, the redundancy wordline selection unit 226 determines the address of the redundancy wordline.

All of the selection units 222, 224, 226, and 228 shown in FIG. 7, have similar configurations with one another except that the test mode signal is not inputted to the sub-wordline selection unit 222 and a delayed signal of the mat-by-mat sub-wordline selection signal BXA (namely, BXAR <0:1> but not shown in FIG. 7) is not outputted from it.

Figure 8:
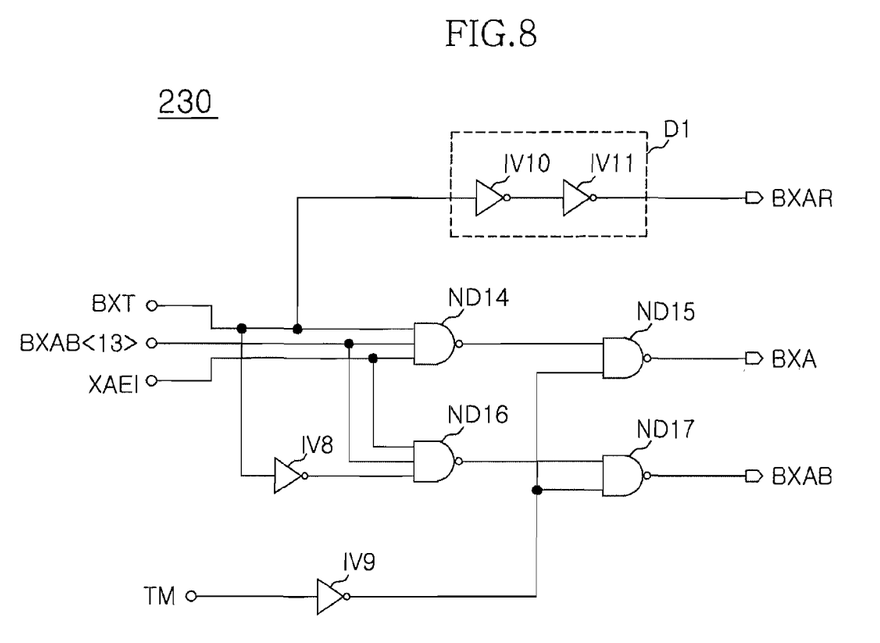
FIG. 8 is a diagram showing an exemplary configuration of a selection unit of FIG. 7.

FIG. 8 is a diagram showing an exemplary configuration of a selection unit of FIG. 7. In FIG. 8, the selection unit 230 receives the row address signal BXT, the most significant row address signal BXAB<13>, the row address enable signal XAEI, and a test mode signal TM as inputs. It outputs the mat-by-mat sub-wordline selection signal BXA, the BXA inverted signal BXAB, and delayed signal BXAR of the row address signal BXT.

The selection unit 230 of FIG. 8 can be applied to the sub-wordline selection unit 222, the main wordline selection unit 224, the redundancy wordline selection unit 226, and the mat selection unit 228 of FIG. 7, respectively. When it is applied to the sub-wordline selection unit 222, the test mode signal TM as input and the delayed signal BXAR of the row address signal BXT as output have only to be removed.

In addition, when the selection unit 230 is applied to the other selection units 224, 226 and 228, the entire wordline test enable signal TM_AWL, the redundancy wordline test enable signal TM_QWL_RED, and the mat-by-mat wordline test signal TM_QWL_MAT are used as the test mode signal TM, respectively.

Referring to FIG. 8, the configuration of the selection unit 230 will now be described in detail. The selection unit 230 includes: a logic element ND14 for receiving the row address signal BXT, the most significant row address signal BXAB<13>, and the row address enable signal XAEI, and a logic element ND15 for receiving the test mode signal TM inverted by an inverter IV19 and an output signal of the logic element ND14 to output the mat-by-mat sub-wordline selection signal BXA.

Here, the logic elements ND14 and ND15 are composed of NAND gates that output signals having low logic levels only when all of input signals are at high logic levels.

The selection unit 230 further includes: a logic element ND16 for receiving the row address signal BXT inverted by an inverter IV18, the most significant row address signal BXAB<13>, the row address enable signal XAEI, and a logic element ND17 for receiving the test mode signal TM inverted by the inverter IV19. It also includes an output signal of the logic element ND16 to output the inverted signal BXAB of the mat-by-mat sub-wordline selection signal BXA.

Here, the logic elements ND16 and ND17 are composed of NAND gates, respectively, so they output signals having low logic levels only when all of the input signals are at high logic levels.

In addition, the selection unit 230 further includes a delay element D1, which delays the row address signal BXT to output as the delayed row address signal BXAR. The delay element D1 can be composed of inverters IV10 and IV11 electrically connected in series.

To perform the test by enabling a part of wordlines for the selected mat, all of the main wordlines need to be enabled, and the sub-wordline need to be selectively enabled in response to an address signal.

As shown in FIG. 6, the mat-by-mat wordline test signal TM_QWL_MAT generated from the partial wordline test enable signal TM_QWL has a low logic level when the partial wordline test enable signal TM_QWL is enabled to a high logic level.

Therefore, the mat selection signals BXA<9:12>, their inverted signals BXAB<9:12>, and the delayed signals BXAR<9:12> of the row address signals BXT<9:12> outputted from the mat selection unit 228 are determined by the row address signals BXT<9:12>, the most significant row address signal BXAB<13>, and the row address enable signal XAEI.

A voltage level of the redundancy wordline test enable signal TM_QWL_RED is determined by the redundancy test enable signal TM_XRED. Although it will be described in more detail in FIG. 9, when the redundancy test enable signal TM_XRED is enabled to a high logic level, the redundancy wordline test enable signal TM_QWL_RED substantially becomes a low logic level.

Therefore, the output signals BXA<3:6>, BXAB<3:6> and BXAR<3:6> of the redundancy wordline selection unit 226 are determined by the row address signals BXT<3:6>, the most significant row address signal BXAB<13> and the row address enable signal XAEI.

In addition, since all of the main wordlines need to be enabled, the main wordline selection unit 224 is controlled by the entire wordline test enable signal TM_AWL. Therefore, the main wordline selection signals can be outputted with high logic levels.

When performing a normal parallel test mode, all row address signals BXA are at high logic levels and all mats and main wordlines are enabled. Consequently, a sub-wordline selected by the row address signals BXT<0:1> is enabled as well.

When performing the test on a bank-by-bank or mat-by-mat basis according to the embodiment, however, it is possible to activate a specific mat by the mat-by-mat wordline test signal TM_QWL_MAT and perform the test by selectively activating a sub-wordline in the mat, which is activated by the row address signals BXT<0:1>.

Figure 9:
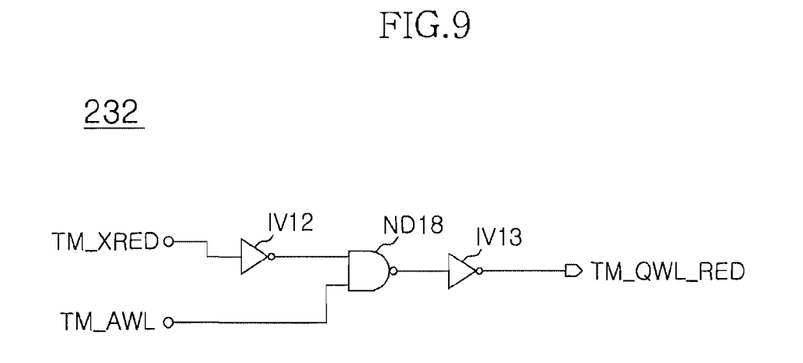
FIG. 9 is a diagram showing an exemplary configuration of a redundancy wordline test enable signal generating unit.

FIG. 9 is a diagram showing an exemplary configuration of a redundancy wordline test enable signal generating unit. In FIG. 9, the redundancy wordline test enable signal (TM_QWL_RED) generating unit 232 receives the redundancy test enable signal TM_XRED and the entire wordline test enable signal TM_AWL. The unit outputs the redundancy wordline test enable signal TM_QWL_RED with a level corresponding to the level of the redundancy test enable signal TM_XRED, regardless of a level of the entire wordline test enable signal TM_AWL.

In this operation, the redundancy wordline test enable signal generating unit 232 can include an inverter IV12 for inverting the redundancy test enable signal TM_XRED, a logic element ND18 for receiving an output signal of the inverter IV12 and the entire wordline test enable signal TM_AWL, and an inverter IV3 for inverting an output signal of the logic element ND18. Here, the logic element ND18 can be composed of a NAND gate.

When performing the probe test mode, the entire wordline test enable signal TM_AWL is inputted with a high logic level. Therefore, the level of the redundancy wordline test enable signal TM_QWL_RED is determined by the level of the redundancy test enable signal TM_XRED.

Meanwhile, sub-wordline selection signals BXA<0:2> of the mat-by-mat sub-wordline selection signal BXA outputted from the mat active circuit 220 become sub-wordline address signal LAX by a decoding operation.

Figure 10:
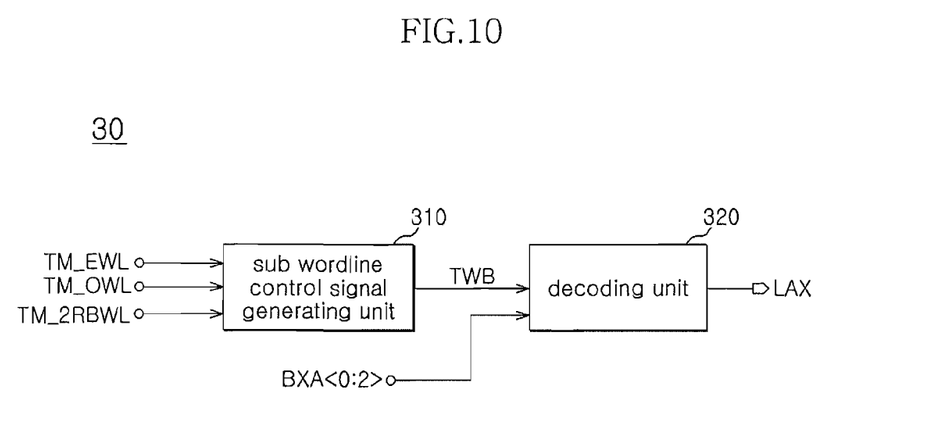
FIG. 10 is a block diagram showing an exemplary configuration of an address decoder of FIG. 1.

FIG. 10 is a block diagram showing an exemplary configuration of an address decoder of FIG. 1. In FIG. 10, the address decoder 30 includes a sub-wordline control signal generating unit 310 and a decoding unit 320.

The sub-wordline control signal generating unit 310 outputs a decoding control signal TWB in response to a wordline-by-wordline test mode signal. Here, the wordline-by-wordline test mode signal can include the sub-wordline enable signal TM_2RBWL, the even wordline test mode signal TM_EWL and the odd wordline test mode signal TM_OWL.

When parallel test mode is initiated by enabling and testing all wordlines, both the even wordline test mode signal TM_EWL and the odd wordline test mode signal TM_OWL have high logic levels. On the contrary, when the test is initiated by selectively enabling wordlines on a mat-by-mat basis, both the even wordline test mode signal TM_EWL and the odd wordline test mode signal TM_OWL have low logic levels.

Meanwhile, the decoding unit 320 decodes the sub-wordline selection signals BXA<0:2> and their inverted signals BXAB<0:2> in response to the decoding control signal TWB. It then outputs the sub-wordline address signal LAX.

In other words, when decoding the sub-wordline selection signals BXA<0:2>, using the decoding control signal TWB makes allows the selection of one sub-wordline per 4 sub-wordlines.

It is currently possible to generate 4-bit sub-wordline address signals LAX<0:3> from the sub-wordline selection signals BXA<0:1>. It is also possible to generate a sub-wordline group selection signal LAX2 from the sub-wordline selection signal BXA<2>.

Figure 11:
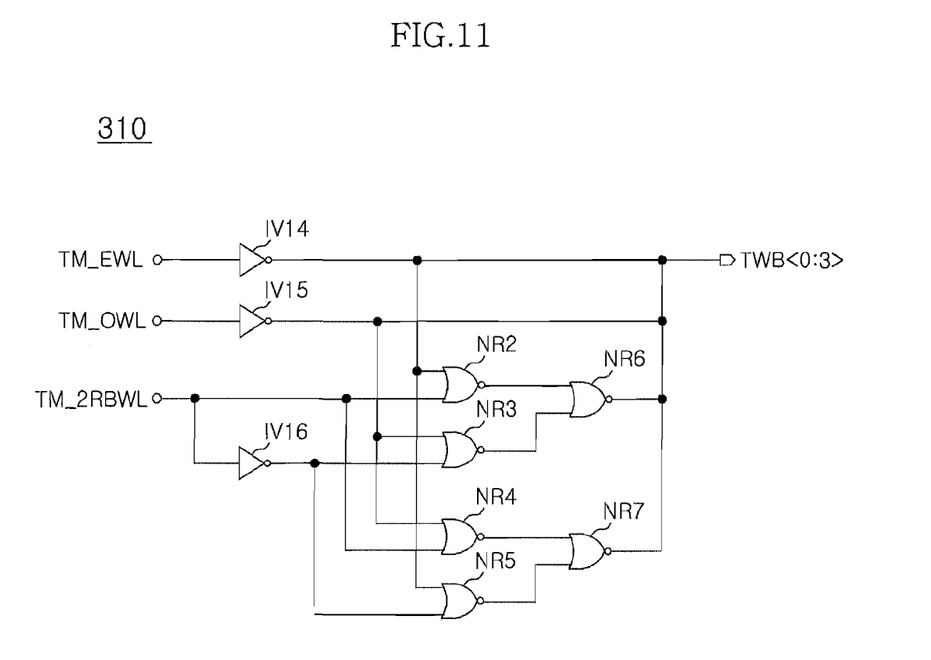
FIG. 11 is a diagram showing an exemplary configuration of a sub-wordline control signal generating unit of FIG. 10.

FIG. 11 is a diagram showing an exemplary configuration of a sub-wordline control signal generating unit of FIG. 10. In FIG. 11, the sub-wordline control signal generating unit 310 includes: an inverter IV14 for inverting the even wordline test mode signal TM_EWL to output a first decoding control signal TWB<0>, and an inverter IV15 for inverting the odd wordline test mode signal TM_OWL to output a second decoding control signal TWB<1>.

In addition, the sub-wordline control signal generating unit 310 includes: a logic element NR2 for receiving an output signal of the inverter IV14 and the sub-wordline enable signal TM_2RBWL, a logic element NR3 for receiving an output signal of the inverter IV15 and the sub-wordline enable signal TM_2RBWL inverted by an inverter IV16, a logic element NR4 for receiving the output signal of the inverter IV15 and the sub-wordline enable signal TM_2RBWL, and a logic element NR5 for receiving the output signal of the inverter IV14 and the sub-wordline enable signal TM_2RBWL inverted by the inverter IV16.

Moreover, the sub-wordline control signal generating unit 310 includes: a logic element NR6 for receiving output signals of the logic elements NR2 and NR3 to output a third decoding control signal TWB<2>, and a logic element NR7 for receiving output signals of the logic elements NR4 and NR5 to output a fourth decoding control signal TWB<3>.

In other words, the first and second decoding control signals TWB<0:1> are inverted signals of the even wordline test mode signal TM_EWL and the odd wordline test mode signal TM_OWL, respectively.

And, logic levels of the third and fourth decoding control signals TWB<2:3> are determined by logic combinations of logic levels of the sub-wordline enable signal TM_2RBWL, the even wordline test mode signal TM_EWL and the odd wordline test mode signal TM_OWL.

Table 2 below shows logic levels of the decoding control signals TWB<0:3> in accordance with logic levels of wordline-by-wordline test mode signal, assuming that the sub-wordline control signal generating unit 310 is configured as shown in FIG. 11.

TABLE 2

| TM_2RBWL | TM_EWL | TM_OWL | TWB<0> | TWB<1> | TWB<2> | TWB<3> |
|---|---|---|---|---|---|---|
| 0 | 0 | 0 | 1 | 1 | 1 | 1 |
| 0 | 0 | 1 | 1 | 0 | 1 | 0 |
| 0 | 1 | 0 | 0 | 1 | 0 | 1 |
| 0 | 1 | 1 | 0 | 0 | 0 | 0 |
| 1 | 0 | 0 | 1 | 1 | 1 | 1 |
| 1 | 0 | 1 | 1 | 0 | 0 | 1 |
| 1 | 1 | 0 | 0 | 1 | 1 | 0 |
| 1 | 1 | 1 | 0 | 0 | 0 | 0 |

Referring to Table 2, when the partial wordline test enable signal TM_QWL is enabled, the entire wordline test enable signal TM_AWL has a high logic level and both the even wordline test mode signal TM_EWL and the odd wordline test mode signal TM_OWL are disabled to low logic levels. Therefore, all of the decoding control signals TWB<0:3> are at high logic levels.

Figure 12:
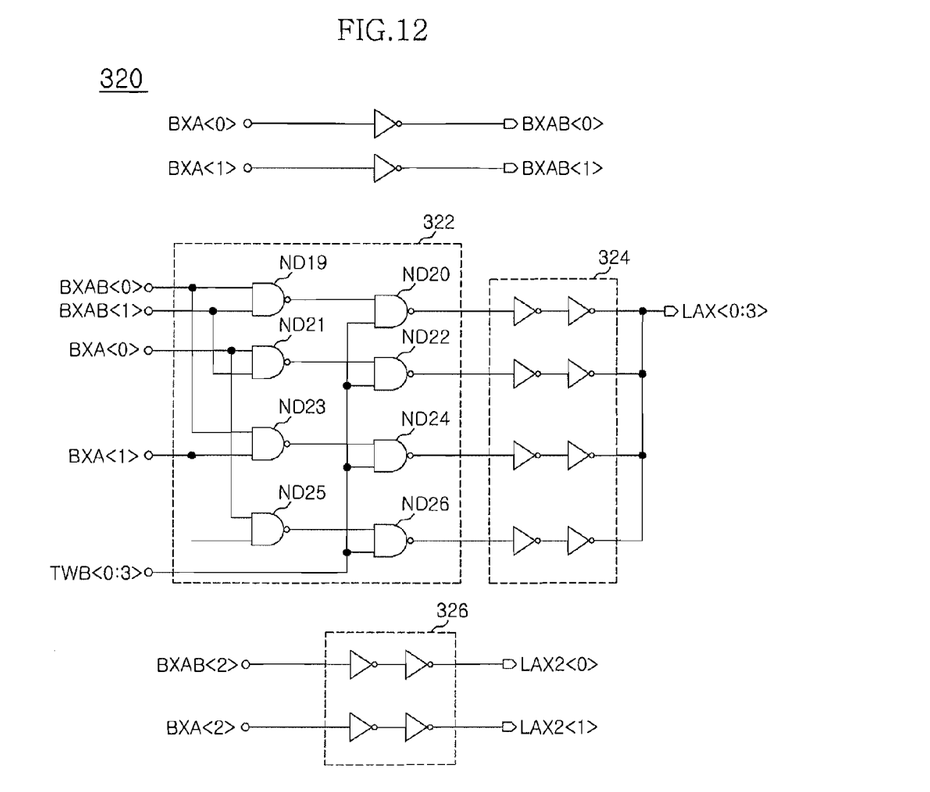
FIG. 12 is a diagram showing an exemplary configuration of a decoding unit of FIG. 10.

FIG. 12 is a diagram showing an exemplary configuration of a decoding unit of FIG. 10. In FIG. 12, the decoding unit 320 includes: a signal combination unit 322 for receiving the sub-wordline selection signals BXA<0:1>, their inverted signals BXAB<0:1> and the decoding control signals TWB<0:3> that generate the sub-wordline address signals LAX<0:3>; a first output driver 324 that drives output signals of the signal combination unit 322; and a second output driver 326 that outputs the sub-wordline selection signal BXA<2> and its inverted signal BXAB<2> as the sub-wordline group selection signal LAX2, respectively.

Referring to Table 2 and FIG. 12, since all of the decoding control signals TWB<0:3> are at high logic levels, the output signals of the signal combination unit 322 are determined by logic combinations of the sub-wordline selection signals BXA<0:1>.

In addition, since the sub-wordline group selection signals LAX2<0:1> outputted from the second output driver 326 are signals that are generated by delaying the sub-wordline selection signal BXA<2> and its inverted signal BXAB<2>, respectively, either the lower group SWL<0:3> or the upper group SWL<4:7> of sub-wordlines are selected.

Therefore, when the first sub-wordline group selection signal LAX2<0> is at a high logic level, one sub-wordline per 4 sub-wordlines of the lower group SWL<0:3> of the sub-wordlines is enabled in response to an output signal of the first output driver 324. On the contrary, when the second sub-wordline group selection signal LAX2<1> is at a high logic level, one sub-wordline per 4 sub-wordlines of the upper group SWL<4:7> of the sub-wordlines is enabled in response to the output signal of the first output driver 324.

Figure 13:
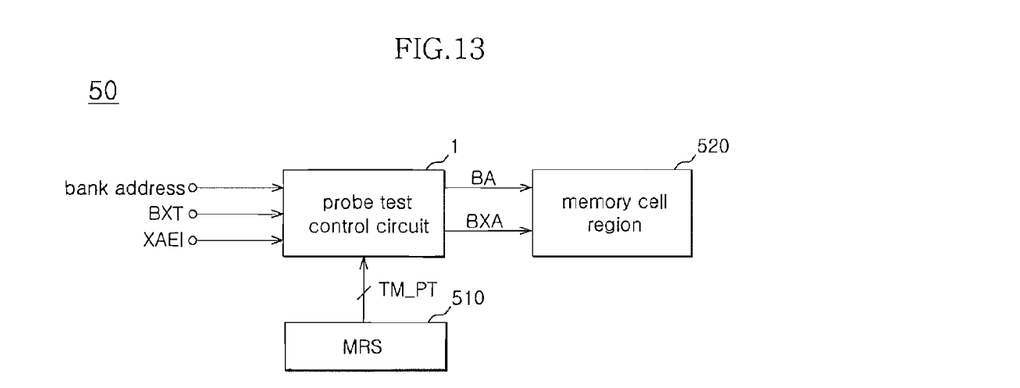
FIG. 13 is a block diagram schematically illustrating an exemplary configuration of a semiconductor memory apparatus.

FIG. 13 is a block diagram schematically illustrating an exemplary configuration of a semiconductor memory apparatus. In FIG. 13, the semiconductor memory apparatus 50, according to the embodiment, includes a probe test control circuit 1, a mode register set (MRS) 510, and a memory cell region 520.

The probe test control circuit 1 receives the bank address, the row address signal BXT and the row address enable signal XAEI. It then generates the bank active signal BA and the mat-by-mat sub-wordline selection signal BXA.

In addition, the mode register set (MRS) 510 provides a bank-by-bank/mat-by-mat test control signal TM_PT to the probe test control circuit 1.

The memory cell region 520 includes a plurality of memory banks, and each bank is partitioned into a plurality of memory mats. Each specific bank is activated by the bank active signal BA that is outputted from the probe test control circuit 1, and a specific mat of the activated bank is activated by the mat-by-mat sub-wordline selection signal BXA. A specific sub-wordline of the activated mat is then enabled.

The probe test control circuit 1 can be configured as shown in FIGS. 1 to 12. Therefore, the probe test control circuit 1 performs the probe test by enabling the specific mat of the specific bank, instead of enabling all banks.

Since the number of enabled mats can vary in response to the row address signal BXT inputted, the driving capability of test equipment controls them.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A probe test control circuit comprising:
   a bank active circuit configured to generate a bank active signal in response to a bank address signal and a bank-by-bank test control signal; and
   a mat active circuit configured to generate a mat-by-mat sub-wordline selection signal and provide the mat-by-mat sub-wordline selection signal to a selected memory bank in response to a row address signal, a row address enable signal, and a mat-by-mat test control signal.

2. The probe test control circuit of claim 1, wherein the bank-by-bank test control signal comprises a bank selection signal, a compact test mode signal, and a parallel test mode signal.

3. The probe test control circuit of claim 2, wherein the bank active circuit comprises:
   a latch unit configured to output an address latch signal for latching the bank selection signal in response to the bank address and the bank selection signal; and
   a bank active signal control unit configured to output the bank active signal in response to the address latch signal, the compact test mode signal, and the parallel test mode signal.

4. The probe test control circuit of claim 3, wherein the bank active signal control unit is configured to output the address latch signal as the bank active signal when the compact test mode signal is enabled.

5. The probe test control circuit of claim 1, wherein the mat-by-mat test control signal comprises a partial wordline test enable signal and an entire wordline test enable signal.

6. The probe test control circuit of claim 5, wherein the mat active circuit comprises:
   a mat selection control unit configured to receive the partial wordline test enable signal and the entire wordline test enable signal to generate a mat-by-mat wordline test signal; and
   a row address control unit configured to decode a mat address and a wordline address to be enabled, in response to the row address signal, the row address enable signal, the entire wordline test enable signal, and the mat-by-mat wordline test signal.

7. The probe test control circuit of claim 6, wherein the mat selection control unit is configured to generate the mat-by-mat wordline test signal of which output level is determined by a level of the partial wordline test enable signal regardless of whether the entire wordline test enable signal is enabled or not, when the partial wordline test enable signal is enabled.

8. The probe test control circuit of claim 7, wherein the row address control unit comprises:
   a sub-wordline selection unit configured to output a sub-wordline selection signal in response to the row address signal;
   a main wordline selection unit configured to output a main wordline selection signal in response to the row address signal and the entire wordline test enable signal; and
   a mat selection unit configured to output a mat selection signal in response to the row address signal and the mat-by-mat wordline test signal.

9. The probe test control circuit of claim 8, wherein the mat-by-mat test control signal further comprises a redundancy test enable signal.

10. The probe test control circuit of claim 9, wherein the probe test control circuit is configured to further comprises a redundancy wordline test enable signal generating unit of which output level is determined by the redundancy test enable signal, and wherein the row address control unit further comprises a redundancy wordline selection unit configured to output a redundancy wordline selection signal in response to the row address signal and the redundancy wordline test enable signal.

11. The probe test control circuit of claim 1, wherein the probe test control circuit further comprises an address decoder configured to generate a sub-wordline address signal in response to the mat-by-mat sub-wordline selection signal output from the mat active circuit and a wordline-by-wordline test mode signal.

12. The probe test control circuit of claim 9, wherein the wordline-by-wordline test mode signal comprises a sub-wordline enable signal, an even wordline test mode signal, and an odd wordline test mode signal.

13. The probe test control circuit of claim 12, wherein the address decoder comprises:
   a sub-wordline control signal generating unit configured to generate a decoding control signal in response to the sub-wordline enable signal, the even wordline test mode signal, and the odd wordline test mode signal; and
   a decoding unit configured to perform a logic combination on the sub-wordline selection signal to generate the sub-wordline address signal and a sub-wordline group selection signal in response to the decoding control signal.

14. A probe test control circuit comprising:
   a bank active circuit configured to activate at least one memory bank to perform a probe test, in response to a bank-by-bank/mat-by-mat test control signal;
   a mat active circuit configured to activate at least one memory mat included in the activated memory bank, in response to the bank-by-bank/mat-by-mat test control signal; and
   an address decoder configured to enable a plurality of wordlines included in the activated memory bank at every predetermined unit, in response to the bank-by-bank/mat-by-mat test control signal.

15. The probe test control circuit of claim 14, wherein the bank active circuit is configured to activate at least one memory bank in response to a bank selection signal and a compact test mode signal.

16. The probe test control circuit of claim 14, wherein the mat active circuit is configured to activate at least one memory mat in response to a partial wordline test enable signal.

17. The probe test control circuit of claim 14, wherein the address decoder is configured to generate a sub-wordline address signal in response to a sub-wordline selection signal and a wordline-by-wordline test mode signal.

18. A semiconductor memory apparatus comprising:
   a memory cell region configured to include a plurality of memory banks, each of the memory banks comprising a memory mat;
   a mode register set configured to generate a bank-by-bank/mat-by-mat test control signal; and
   a probe test control circuit configured to generate a bank active signal and a mat-by-mat sub-wordline selection signal and provide them to the memory cell region, in response to the bank-by-bank/mat-by-mat test control signal and a row address signal.

19. The semiconductor memory apparatus of claim 18, wherein the bank-by-bank/mat-by-mat test control signal comprises a bank selection signal, a compact test mode signal, and a parallel test mode signal, and the probe test control circuit is configured to output the address latch signal as the bank active signal in response to an address latch signal for latching the bank selection signal, the compact test mode signal and the parallel test mode signal when the compact test mode signal is enabled.

20. The semiconductor memory apparatus of claim 18, wherein the bank-by-bank/mat-by-mat test control signal comprises a partial wordline test enable signal, an entire wordline test enable signal, and a mat-by-mat wordline test signal, and the probe test control circuit is configured to decode a mat address and a wordline address in response to the row address signal, the entire wordline test enable signal and the mat-by-mat wordline test signal.

21. The semiconductor memory apparatus of claim 20, wherein an output level of the mat-by-mat wordline test signal is configured to be determined by a level of the partial wordline test enable signal regardless of whether the entire wordline test enable signal is enabled or not, when the partial wordline test enable signal is enabled.

* * * * *